(12) United States Patent
Yamamoto et al.

(10) Patent No.: US 7,005,860 B2
(45) Date of Patent: Feb. 28, 2006

(54) INSULATION RESISTANCE DROP DETECTOR AND METHOD OF DETECTING STATE THEREOF

(75) Inventors: Kouichi Yamamoto, Shizuoka (JP); Satoshi Ishikawa, Shizuoka (JP); Kenji Uchida, Aichi (JP); Toshihiro Katsuta, Aichi (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/959,503

(22) Filed: Oct. 7, 2004

(65) Prior Publication Data
US 2005/0073317 A1 Apr. 7, 2005

(30) Foreign Application Priority Data
Oct. 7, 2003 (JP) ............................. 2003-347893

(51) Int. Cl.
*G01R 31/00* (2006.01)
*G08B 21/00* (2006.01)

(52) U.S. Cl. ...................... 324/527; 324/503; 324/509; 324/551; 340/647

(58) Field of Classification Search ................. 324/527
See application file for complete search history.

(56) References Cited

U.S. PATENT DOCUMENTS 6,906,525 B1 * 6/2005 Suzuki ....................... 324/509

FOREIGN PATENT DOCUMENTS

JP H8-70503 3/1996

* cited by examiner

*Primary Examiner*—Vincent Q. Nguyen
*Assistant Examiner*—Timothy J. Dole
(74) *Attorney, Agent, or Firm*—Finnegan, Henderson, Farabow, Garrett & Dunner, L.L.P.

(57) ABSTRACT

An insulation resistance drop detector 50 and a method of detecting a state of malfunction of the detector 50 are provided. When open of a coupling capacitor Co or malfunction of a lowpass filter 53 is occurred, a time constant of the low pass filter 53 is decreased and a rising time of an output of the lowpass filter 53 against an output of a pulse signal P1 becomes shorter than that in a state of normal. Thereby, malfunction of the detector 50 can be detected based on the output of the filter 53 corresponding to change of frequency of the pulse signal P1.

7 Claims, 4 Drawing Sheets

EARTH NOT DETECTED    EARTH DETECTED

OUTPUT OF OSCILLATOR

VOLTAGE AT
CONNECTING POINT P

COMPARATOR
21

SMOOTHING CIRCUIT
26

COMPARATOR
27      LOW

INSULATION RESISTANCE DROP DETECTOR AND METHOD OF DETECTING STATE THEREOF

BACKGROUND OF THE INVENTION

1. Field of the Invention

This invention relates to a method of detecting a state of malfunction of an insulation resistance detecting circuit (a detector) for detecting a drop of the insulation resistance between a body of vehicle and a direct-current power supply, and the insulation resistance drop detector acting the method of detecting the state of malfunction of the detector.

2. Description of the Related Art

As an aforesaid insulation resistance drop detector, an earth detecting circuit for an electric vehicle described in Patent Document 1 exists. The electric car has a drive circuit system A including a battery unit B for a high voltage (200–300V) direct-current power supply, an inverter 2 as an AC-DC converter for converting direct current supplied through a plus bus line 4 as a positive direct-current supply electric wire and a minus bus line 5 as a negative direct-current supply electric wire from the battery unit B to alternating current, an AC motor being supplied alternating current through a U-phase line 6, a V-phase line 7 and a W-phase line 8 as alternating-current supply electric wires from the inverter 2, as shown in FIG. 4, 5. The earth detecting circuit is for detecting earth from the battery unit B to a body of vehicle E in the drive circuit system A. The earth detecting circuit includes an oscillating circuit 10 as an alternating signal output circuit and a detecting circuit 20 as a circuit for detecting voltage level change. A coupling capacitor 10A is connected with a connecting point P between the oscillating circuit 10 and the detecting circuit 20 and the plus bus line 4 of the battery unit B in the drive circuit system A, so that direct current element is cut off.

An oscillator 11 in the oscillating circuit 10 generates rectangular wave pulse having 50% duty ratio of constant frequency (see right and left charts in FIG. 5A). Thereafter, an impedance converter 12 outputs rectangular wave pulse with the same duty ratio. An alternating signal output of the oscillating circuit 10 exists at the connecting point P through a detecting resistor 13. The detecting resistor 13 functions as a voltage divider together with an insulating resistor 31 when earth is occurred.

The detecting circuit 20 includes a comparator 21 for comparing a voltage at the connecting point P between the detecting resistor 13 and the coupling capacitor 10A, in which the alternating signal output of the oscillating circuit 10 exists, and a reference voltage V1. The connecting point P is connected with an inverting input terminal of the comparator 21. A noninverting input terminal of the comparator 21 is connected with a reference voltage circuit for defining the reference voltage V1 by voltage dividing resistors 22, 23.

An output side of an operational amplifier structuring the impedance converter 12 and an input side of an operational amplifier structuring the comparator 21 are connected with diodes 15–18 for protecting the operational amplifiers from a reverse voltage or an over voltage when earth is occurred.

According to this circuit, in the state of normal when earth is not occurred, a resistance of the insulating resistor 31 shown in FIG. 4 is extremely larger than that of the detecting resistor 13. Therefore, rectangular wave pulse having a larger peak value than the predetermined reference voltage V1 is outputted at the connecting point P in which a value divided with the resistances of the insulating resistor 31 and the detecting resistor 13 exists (see a left chart in FIG. 5B).

Thereby, the rectangular wave pulse having the larger peak value than the predetermined reference voltage V1 is inputted to the inverting input terminal of the comparator 21 and a rectangular wave pulse with 50% duty ratio is outputted from the comparator 21 (see a left chart in FIG. 5C). Thereafter, a smoothed voltage Vr formed by a smoothing circuit 26 with a resistor 24 and a capacitor 25 becomes smaller than the reference voltage V1 (see a left chart in FIG. 5D) and is inputted to the noninverting input terminal of the comparator 27 so that an output of the comparator 27 becomes low level showing the state of normal (see a left chart in FIG. 5E).

When earth is occurred between the minus bus line and the body of vehicle E, and the resistance of the insulating resistor 31 shown in FIG. 4 is decreased, rectangular wave pulse having a smaller peak value than the predetermined reference voltage V1 is outputted at the connecting point P in which a value divided with the resistances of the insulating resistor 31 and the detecting resistor 13 exists (see a right chart in FIG. 5B) Thereby, the rectangular wave pulse having the smaller peak value than the predetermined reference voltage V1 is inputted to the inverting input terminal of the comparator 21 and an output from the comparator 21 is changed to 100% duty wave (see a right chart in FIG. 5C).

Thereby, the smoothed voltage Vr formed by the smoothing circuit 26 with the resistor 24 and the capacitor 25 becomes larger than the reference voltage V1 (see a right chart in FIG. 5D) and is inputted to the noninverting input terminal of the comparator 27 so that the output of the comparator 27 becomes high level showing the drop of the insulation resistance (see a right chart in FIG. 5E). Thus, the earth is detected by a logical level of the comparator 27 when the earth is occurred at the battery unit B.

The document 1 is Japan Patent Application Laid Open H8-70503.

Objects to be Solved

There is a drawback that the above earth detecting circuit cannot detect whether the earth detecting circuit itself is in state of malfunction or normal.

To overcome the above drawback, one object of this invention is to provide a method of detecting a state of malfunction of an insulation resistance drop detector and the insulation resistance drop detector acting the method of detecting the state of malfunction of the detector.

How to Attain the Object

In order to attain the objects, a method of detecting a state of malfunction of an insulation resistance drop detector according to this invention is specified in the detector having a detecting resistor connected in series with an insulating resistor between a body of vehicle and a direct-current power supply, a coupling capacitor disposed between the insulating resistor and the detecting resistor, a pulse signal generator supplying a pulse signal into a series circuit composed of the insulating resistor, the coupling capacitor and the detecting resistor, a filter for eliminating a signal having a specific frequency from a voltage at a connecting point between the coupling capacitor and the detecting resistor, and a sensor for sensing the drop of the insulation resistance based on an output from the filter, by changing a frequency of the pulse signal, and detecting the state of malfunction of the insulation resistance drop detector based on the output of the filter when the frequency is changed.

According to the above method, when the coupling capacitor is opened or the filter is in the state of malfunction, a time constant of the filter is decreased and a rising time of an output of the filter against a pulse signal output becomes shorter than that in the state of normal. The rising times of the output of the filter between in the states of malfunction and normal differ from each other so that, by changing a frequency of the pulse signal, the state of the detector can be detected based on the output of the filter when the frequency is changed.

The method of detecting the state of malfunction of the detector according to this invention is more specified in the aforesaid method by changing the frequency of the pulse signal to be increased when the detector is detecting.

According to the method described above, the frequency of the pulse signal is increased when the detector is detecting. By changing the frequency, the difference of the rising times of the outputs of the filter between in the states of malfunction and normal makes a difference of output levels of the filter. Thereby, the state of the insulation resistance drop detector can be detected based on the outputs level of the filter when the frequency is changed.

The method of detecting the state of malfunction of the detector according to this invention is further specified in the aforesaid method by detecting the state of normal of the insulation resistance drop detector when change of the output of the filter can be detected corresponding to changing the frequency of the pulse signal to be increased.

According to the method described above, the state of normal of the insulation resistance drop detector can be detected when change of the output of the filter corresponding to increasing frequency is detected, i.e. when the rising time of the output or the filter can be detected not to be shorter than that in the state of normal.

The method of detecting the state of malfunction of the detector according to this invention is further specified in the aforesaid method by outputting pulse signal of a first frequency while the detector is detecting, outputting pulse signal of a second frequency larger than the first frequency when the state of malfunction is detected, and detecting the state of normal of the insulation resistance drop detector when the output of the filter corresponding to pulse signal of the first frequency is a first predetermined value or more and the output of the filter corresponding to pulse signal of the second frequency is a second predetermined value, smaller than the first predetermined value, or less.

According to the method described above, the pulse signal of the first frequency is outputted while the detector is detecting, and the pulse signal of the second frequency larger than the first frequency is outputted when the state of malfunction is detected. When the output of the filter corresponding to the pulse signal of the first frequency is the first predetermined value or more and the output of the filter corresponding to pulse signal of the second frequency is the second predetermined value, smaller than the first predetermined value, or less, the state of normal of the detector is detected. Therefore, by comparing the output of the filter with the first and second predetermined values, change of the output of the filter can be easily judged.

The method of detecting the state of malfunction of the detector according to this invention is further specified in the aforesaid method by detecting the state of malfunction of the insulation resistance drop detector when the output of the filter is a third predetermined value or more and no change of the output of the filter can be detected corresponding to changing the frequency of the pulse signal to be increased.

According to the method described above, the state of malfunction of the insulation resistance drop detector is detected when the output of the filter is the third predetermined value or more and no change of the output of the filter can be detected corresponding to changing the frequency of the pulse signal to be increased. Thereby, when malfunction to shorten rising time of the filter against the output of the pulse signal by decreasing the time constant of the filter such as open of the coupling capacitor is occurred, the state of malfunction can be detected.

The method of detecting the state of malfunction of the detector according to this invention is further specified in the aforesaid method by detecting the state of malfunction of the insulation resistance drop detector when the output of the filter is a fourth predetermined value smaller than the third predetermined value or less and no change of the output of the filter can be detected corresponding to changing the frequency of the pulse signal to be increased.

According to the method described above, the state of malfunction of the insulation resistance drop detector is detected when the output of the filter is the fourth predetermined value smaller than the third predetermined value or less and no change of the output of the filter can be detected corresponding to changing the frequency of the pulse signal to be increased. Thereby, when malfunction not to rise the output of the filter corresponding to the output of the pulse signal such as short of the coupling capacitor or the filter is occurred, the state of malfunction can be detected.

An insulation resistance drop detector, the insulation resistance existing between a body of vehicle and a series-current power supply, according to this invention is specified by including a detecting resistor being connected in series with an insulating resistor between the body of vehicle and the direct-current power supply, a coupling capacitor being disposed between the insulating resistor and the detecting resistor, a pulse signal generator supplying a pulse signal into a series circuit composed of the insulating resistor, the coupling capacitor and the detecting resistor, a filter for eliminating a signal having a specific frequency from a voltage at a connecting point between the coupling capacitor and the detecting resistor, a sensor for sensing the drop of the insulation resistance based on an output from the filter, a changing device for changing a frequency of the pulse signal, and a detecting device for detecting state of malfunction of the insulation resistance drop detector based on the output of the filter when the frequency is changed.

According to the detector described above, when the coupling capacitor is opened or the filter is in the state of malfunction, a time constant of the filter is decreased so that a rising time of the filter against the output of the pulse signal becomes shorter than that in the state of normal. The rising times of the output of the filter between in the states of malfunction and normal differ from each other so that, by changing a frequency of the pulse signal, the state of the detector can be detected based on the output of the filter when the frequency is changed.

The above and other objects and features of this invention will become more apparent from the following description taken in conjunction with the accompanying drawings.

DESCRIPTION OF THE PREFERRED EMBODIMENT

Figure 1:
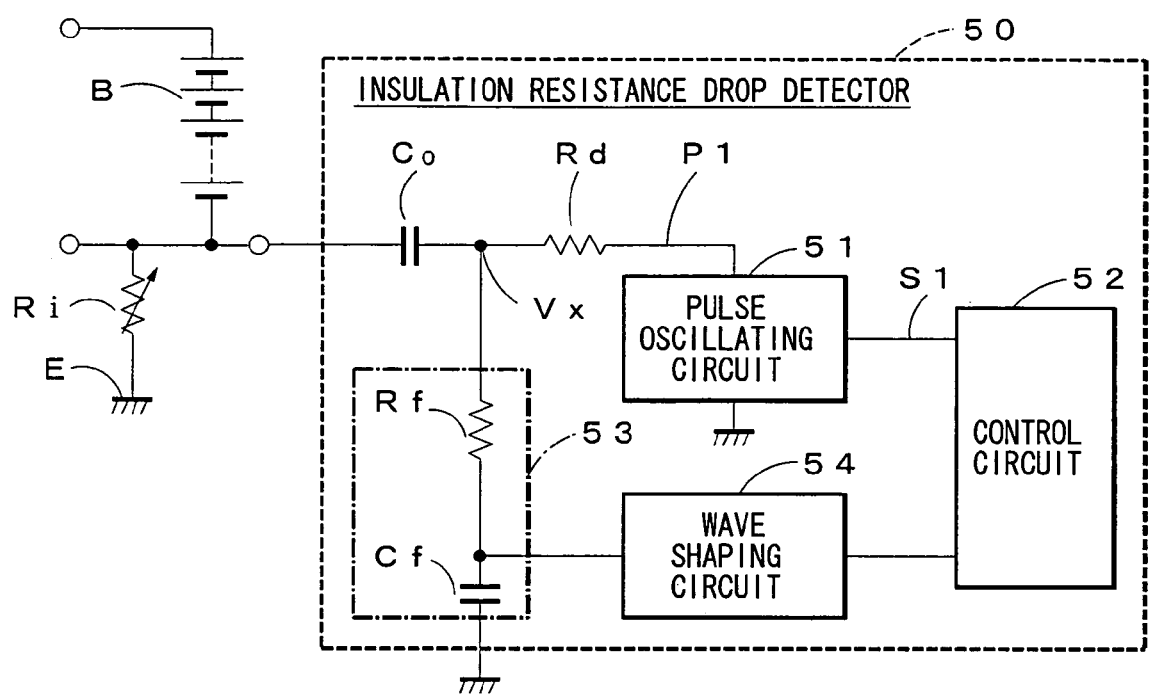
FIG. 1 is a circuit diagram of an embodiment of an insulation resistance drop detector acting a method of detecting the state of malfunction of the detector according to this invention.

The method of detecting the state of malfunction of the detector and the insulation resistance drop detector will be explained with reference to drawings, hereafter. FIG. 1 is a circuit diagram showing an embodiment of the insulation resistance drop detector acting the method of detecting the state of malfunction of the detector.

As shown in FIG. 1, an insulation resistance drop detector 50 has a detecting resistor Rd connected in series with an insulating resistor Ri between a battery supply B as a direct-current power supply and a body of vehicle E, and a coupling capacitor Co disposed between the insulating resistor Ri and the detecting resistor Rd. The detector 50 further includes a pulse oscillating circuit 51 (as the pulse signal generator) for supplying rectangular wave pulse signal P1 with a predetermined peak value to a series circuit structured by the insulating resistor Ri, the coupling capacitor Co and the detecting resistor Rd.

The pulse oscillating circuit 51 has a constant amplitude pulse generating circuit and can change a frequency of the rectangular wave pulse outputted from the constant amplitude pulse generating circuit by inputting frequency signal S1 for the rectangular wave pulse signal P1 to the constant amplitude pulse generating circuit from a control circuit 52.

A voltage Vx at a connecting point between the coupling capacitor Co and the detecting resistor Ri becomes a value by a formula F1 dividing the peak value Vp of the rectangular wave pulse signal P1 with detecting resistance Rd (t) of the detecting resistor Rd and insulation resistance Ri (t) of the insulating resistor Ri.

$$Vx = Vp \times Ri(t)/(Rd(t)+Ri(t)) \qquad F1$$

Therefore, when the insulation resistance Ri(t) is larger than the detecting resistance Rd (t) in the state of normal, the voltage Vx at the connecting point becomes pulse with the substantially same peak value as that of the rectangular wave pulse signal P1. On the other hand, when the insulation resistance Ri(t) is decreased and becomes smaller comparing with detecting resistance Rd(t), the voltage Vx at the connecting point becomes smaller.

The insulation resistance drop detector 50 further includes a lowpass filter 53 (as a filter) filtering a signal of a predetermined frequency and more from the voltage Vx at the connecting point. The lowpass filter 53 is formed with a resistor Rf and a capacitor Cf and disposed for eliminating noise overlapped on the voltage Vx at the connecting point. An output of the lowpass filter 53 is shaped by a waveform shaping circuit and supplied to a control circuit 52. The control circuit 52 is structured with for example a microcomputer.

Principle of the method of detecting the state of malfunction of the insulation resistance drop detector will be described as follows with reference to FIG. 2, 3. Curve (a) in FIG. 2 is a graph showing relation between the frequency of the rectangular wave pulse signal P1 in the state of normal, in which the insulation resistance Ri(t) is not decreased and the detector 50 is not in the state of malfunction, and a peak value of pulse output from the lowpass filter 53.

Figure 2:
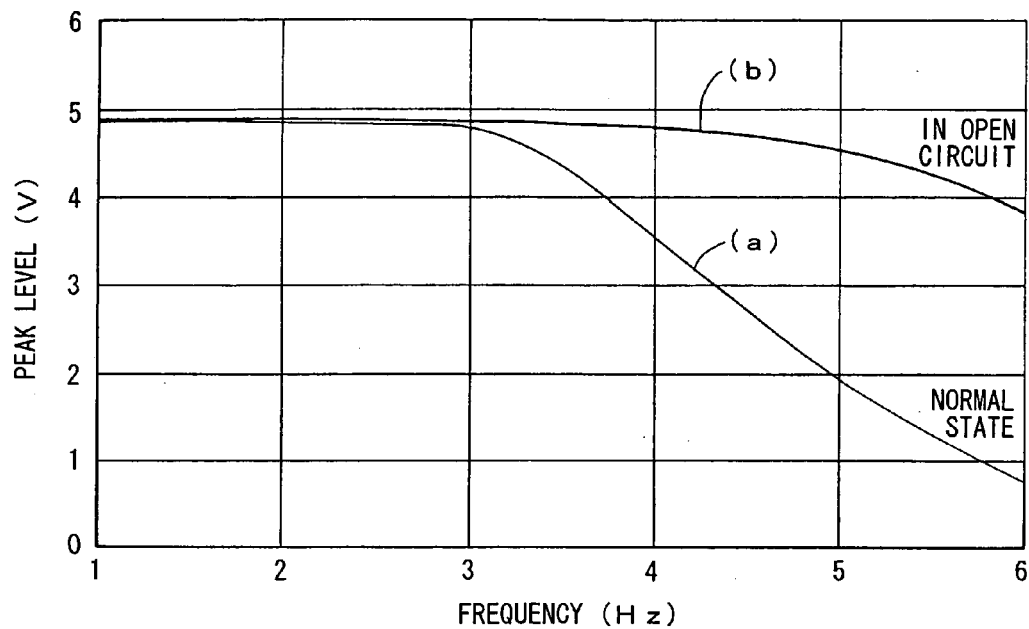
FIG. 2 is a graph showing relation between frequency of a rectangular wave pulse signal P1 and a peak value of an output of a lowpass filter 53 in the state of normal and in open.

As shown by the curve (a) in FIG. 2, in the state of normal, when the frequency supplied from the pulse oscillating circuit 51 is lower than 3 Hz, the peak value of the output of the lowpass filter 53 is substantially the same as that of the rectangular wave pulse signal P1 outputted from the pulse oscillating circuit 51. On the other hand, according to increasing the frequency supplied form the pulse oscillating circuit 51 over 3 Hz, the peak value of the output of the lowpass filter 53 is decreased.

Physically, by supplying the rectangular wave pulse signal P1 of frequency 4 Hz over 3 Hz, the peak value of the output of the lowpass filter 53 becomes 3.56 V. When the frequency is more increased to 5 Hz, the peak value becomes 1.92 V and when the frequency is 6 Hz, the peak value is 0.68 V.

In the state of normal, the time constant of the lowpass filter 53 is large. When the frequency of the rectangular wave pulse signal P1 is increased over 3 Hz, before the output of the lowpass filter 53 increase to 5 V as the peak value of the rectangular wave pule signal P1, supply of the rectangular wave pulse signal P1 is stopped. Thereby, the peak value of the output of the lowpass filter becomes lower than 5 V. Supplying the rectangular wave pulse signal with more increased frequency, the peak value of the output of the lowpass filter 53 becomes more lower.

Curve (b) in FIG. 2 is a graph showing relation between the frequency of the rectangular wave pulse signal P1 in the state of malfunction, in which the coupling capacitor Co or the capacitor Cf is opened in the detector 50, and a peak value of pulse output from the lowpass filter 53.

As shown by the curve (b) in FIG. 2, in the state of malfunction, the peak value of the output of the lowpass filter 53 is maintained substantially in constant even if the frequency is increasing. In the state of malfunction of open of the coupling capacitor Co or the capacitor Cf, the time constant of the lowpass filter 53 is decreased corresponding to removing the capacitor Co against the state of normal. Thereby, the rising time of the output of the lowpass filter 53 is shorter than that in the state of normal.

When the coupling capacitor Co is opened, i.e. when electrical connection between the detector 50 and the insulating resistor Ri is cut, the peak value of the output of the lowpass filter 53 corresponding to supply of the rectangular wave pulse signal P1 is always equal to the peak value of the rectangular wave pulse signal P1. Therefore, when the insulation resistance Ri(t) is decreased, the output of the lowpass filter 53 is not decreased, so that the drop of the insulation resistance Ri(t) cannot be detected.

When the capacitor Cf of the lowpass filter 53 is opened, a part of signal cannot be removed by the lowpass filter 53 so that the output with noise maybe supplied to the control circuit 52. Therefore, the drop of the insulating resistor Ri cannot be detected securely.

In the method of detecting the state of malfunction of the detector according to this invention, by using the difference of the rising times in the states of malfunction and normal of the lowpass filter 53, when change of the peak value of the output of the lowpass filter 53 if the frequency of the rectangular wave pulse signal P1 is increasing, the state of normal is detected. On the other hand, when the peak value of the output of the lowpass filter 53 is 3 V or more, and no change can be detected if the frequency of the rectangular wave pulse signal P1 is increasing, the state of malfunction is detected.

Figure 3:
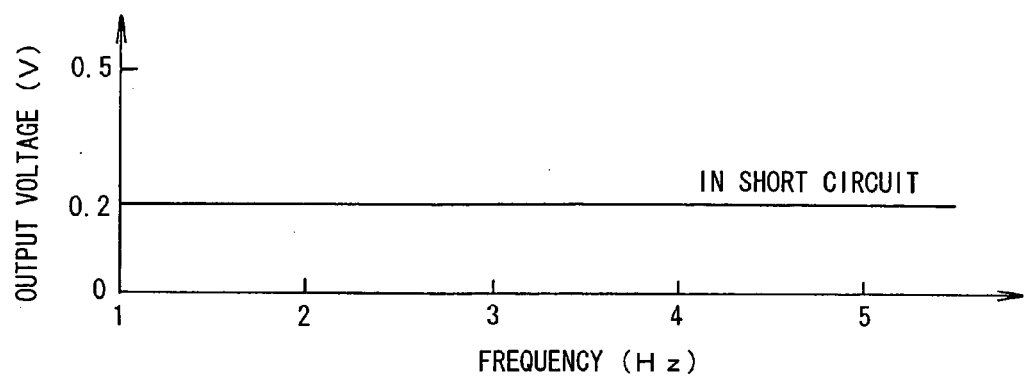
FIG. 3 is a graph showing relation between frequency of a rectangular wave pulse signal P1 and a peak value of an output of a lowpass filter 53 in short.
Figure 4:
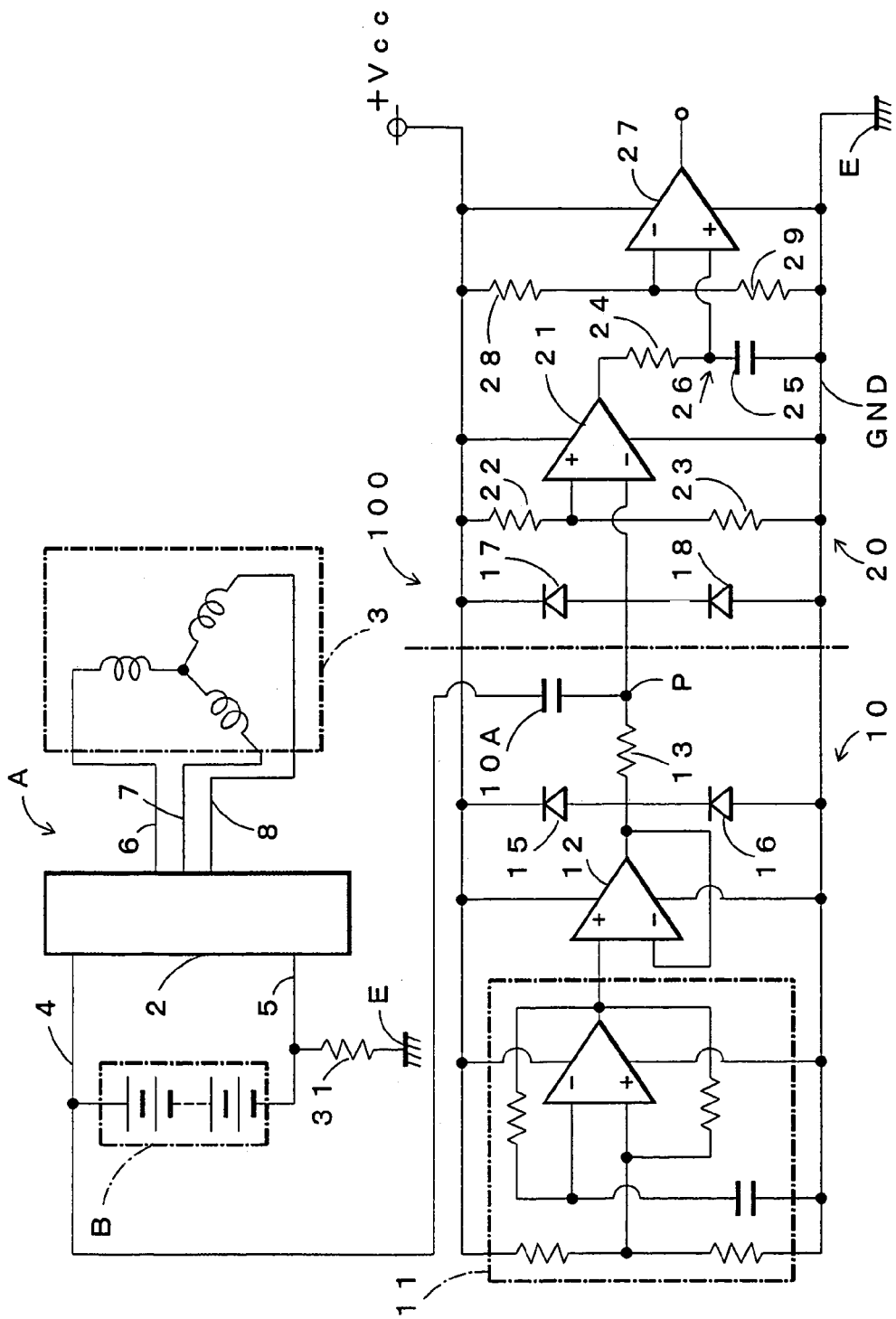
FIG. 4 is a circuit diagram of an example of an earth detecting circuit by prior art.
Figure 5A:
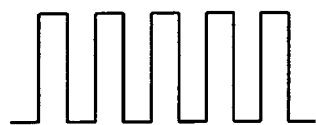
FIG. 5A–5E are time charts for describing actions of the circuit shown in FIG. 4.
Figure 5A:
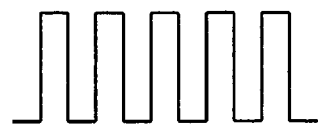
Figure 5B:
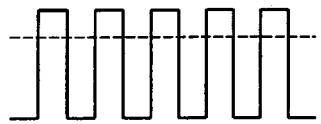
Figure 5B:
Figure 5C:
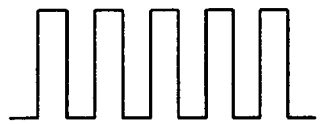
Figure 5C:
Figure 5D:
Figure 5D:
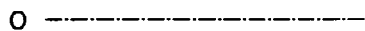
Figure 5D:
Figure 5E:
Figure 5E:
Figure 5E:
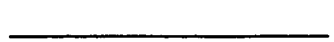
Figure 5E:
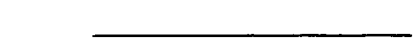

FIG. 3 is a graph showing relation between frequency of the rectangular wave pulse signal P1 and the output voltage of the lowpass filter 53 in the state of malfunction in which the coupling capacitor Co or the capacitor Cf is shorted in the detector 50.

When the coupling capacitor Co or the capacitor Cf is shorted, the output of the lowpass filter 53 does not rise even if the rectangular wave pulse signal P1 is outputted. Therefore, the output of the lowpass filter 53 maintains approximately 0.2 V in constant for increasing the frequency.

Thus, when the coupling capacitor Co or the capacitor Cf is shorted, the output of the lowpass filter 53 corresponding to supply of the rectangular wave pulse signal P1 is constantly low level. Thereby, although the insulation resistance Ri(t) is not decreased, the output of the lowpass filter 53 is low level, so that decreasing of the insulation resistance Ri(t) cannot be detected.

According to the method of detecting the state of malfunction of the detector described in this invention, when the output voltage of the lowpass filter 53 is 0.5 V or less, and no change thereof can be detected if the frequency of the rectangular wave pulse signal P1 is increasing, the state of malfunction is detected.

Actions of the insulation resistance drop detector acting the above method of detecting the state of malfunction of the detector will be descried hereafter. Usually, the control circuit 52 performs as a sensor for sensing a drop so as to output the rectangular wave pulse signal P1 with frequency of 3 Hz and sense the drop of the insulation resistance Ri (t) based on the peak value of the output of the lowpass filter 53. Physically, when the peak value of the output of the lowpass filter 53 is substantially the same as the peak value of the rectangular wave pulse signal P1, it is judged that the insulation resistance is not recreated. On the other hand, when the peak value of the output of the lowpass filter 53 is decreased to reach into a predetermined range (0.5–2.0 V), the decrease of the insulation resistance Ri(t) is detected.

The above predetermined range is set more than 0.5 V for detecting the state of malfunction by aforesaid short. Thereby, decrease of the insulation resistance Ri(t) corresponding to the predetermined range, physically decrease to few MΩ–few KΩ, and the state of malfunction by short can be both detected.

The above control circuit 52 stops detecting the drop of the insulation resistance Ri (t) by a predetermined trigger such as turning ON of an ignition switch, and starts detecting the state of malfunction of the detector 50 so as to perform as a changing device for changing the frequency to change the frequency of the rectangular wave pulse signal P1 from 2.5 Hz to 5.5 Hz.

Thereafter, the control circuit 52 performs as a detecting device so as to detect that the detector 50 is in the state of normal by judging that the peak value is decreasing in accordance with increasing frequency when the peak value of the output of the lowpass filter 53 is 3 V or more for outputting the rectangular wave pulse signal P1 of 2.5 Hz, and the peak value of the output of the lowpass filter 53 is 2 V or less for outputting the rectangular wave pulse signal P1 of 5.5 Hz.

On the other hand, when the peak values of the lowpass filter 53 for outputting the rectangular wave pulse signals P1 of frequencies of 2.5 Hz and 5.5 Hz are both 3 V or more, by judging no change of the peak value of 3 V or more for increase of the frequency, the control circuit 52 detects that the detector 50 is in the state of malfunction by open.

When the peak values of the lowpass filter 53 for outputting the rectangular wave pulse signals P1 of frequencies of 2.5 Hz and 5.5 Hz are both 0.5 V or less, by judging no change of the peak value of 0.5 V or less for increase of the frequency, the control circuit 52 detects that the detector 50 is in the state of malfunction by short.

According to the aforesaid method of detecting the state of malfunction of the detector, by changing the frequency to be increased, difference of the rising times of the outputs of the lowpass filter 53 in the states of malfunction and normal make difference of peak values of the outputs of the lowpass filter 53. Thereby, the condition of the detector 50 can be detected based on the output of the lowpass filter for changing the frequency.

According to the detector 50, when the peak values of the outputs of the lowpass filter 53 for the frequencies of 2.5 Hz and 5.5 Hz are both 3 V as the third predetermined value or more, by judging that the output of the lowpass filter 53 is 3 V or more and unchanged, the state of malfunction is detected.

Thereby, when a malfunction that a rising time of the lowpass filter 53 against the output of the rectangular wave pulse signal P1 becomes shorter than that in the state of normal by decrease of a time constant of the lowpass filter 53 by open of the coupling capacitor Co or the capacitor Cf (i.e. malfunction of the lowpass filter 53) is occurred, the state of malfunction can be detected. Furthermore, by comparing the output of the lowpass filter 53 with 3 V, it is judged easily that the peak value of the output of the lowpass filter 53 is 3 V or more and unchanged.

According to the detector 50, when the output voltages of the lowpass filter 53 for the frequencies of 2.5 Hz and 5.5 Hz are both 0.5 V as the fourth predetermined value or less, by judging that the output of the lowpass filter 53 is 0.5 V or less and unchanged, the state of malfunction is detected.

Thereby, when a malfunction that the output of the lowpass filter 53 does not rise corresponding to the output of the rectangular wave pulse signal P1 by short of the coupling capacitor Co or the capacitor Cf is occurred, the state of malfunction can be detected. Furthermore, by comparing the output of the lowpass filter 53 with 0.5 V, it is judged easily that the output voltage of the lowpass filter 53 is 0.5 V or less and unchanged.

According to the detector 50, when the output voltage of the lowpass filter 53 for the frequencies of 2.5 Hz is 3 V as the first predetermined value and the output voltage of the lowpass filter 53 for the frequencies of 5.5 Hz is 2 V as the second predetermined value or less, the state of normal is detected. Therefore, by comparing the output of the lowpass filter 53 with 3V and 2 V, it can be easily judged that the peak value of the output of the lowpass filter 53 is changed.

In the above embodiment, the control circuit 52 is structured with a microcomputer. It also can be structured with a comparator.

Although the present invention has been fully described by the above embodiment, it is to be noted that various change and modifications can be made with the scope of the present invention as defined by the following claims.

What is claimed is:

1. A method of detecting a state of malfunction of an insulation resistance drop detector, the detector including a detecting resistor connected in series with an insulating resistor between a body of vehicle and a direct-current power supply, a coupling capacitor disposed between the insulating resistor and the detecting resistor, a pulse signal generator supplying a pulse signal into a series circuit composed of the insulating resistor, the coupling capacitor and the detecting resistor, a filter for eliminating a signal having a specific frequency from a voltage at a connecting point of the coupling capacitor with the detecting resistor, and a sensor for sensing the drop of the insulation resistance based on an output from the filter, comprising the steps of:

changing a pulse frequency of the pulse signal; and detecting the state of malfunction of the insulation resistance drop detector based on the output of the filter when the frequency has changed.

2. The method of detecting the state of malfunction of the detector according to claim 1, further comprising a step of changing the frequency of the pulse signal to be increased while the detector is detecting.

3. The method of detecting the state of malfunction of the detector according to claim 2, further comprising a step of detecting a state of normal of the insulation resistance drop detector when change of the output of the filter can be detected corresponding to changing the frequency of the pulse signal to be increased.

4. The method of detecting the state of malfunction of the detector according to claim 3, further comprising the steps of:

outputting pulse signal of a first frequency while the detector is detecting;

outputting pulse signal of a second frequency larger than the first frequency when the detector detects the state of malfunction; and detecting the state of normal of the insulation resistance drop detector when the output of the filter corresponding to pulse signal of the first frequency is a first predetermined value or more and the output of the filter corresponding to pulse signal of the second frequency is a second predetermined value, smaller than the first predetermined value, or less.

5. The method of detecting the state of malfunction of the detector according to claim 2, 3 or 4, further comprising a step of detecting the state of malfunction of the insulation resistance drop detector when the output of the filter is a third predetermined value or more and no change of the output of the filter can be detected corresponding to changing the frequency of the pulse signal to be increased.

6. The method of detecting the state of malfunction of the detector according to claim 5, further comprising a step of detecting the state of malfunction of the insulation resistance drop detector when the output of the filter is a fourth predetermined value smaller than the third predetermined value or less and no change of the output of the filter can be detected corresponding to changing the frequency of the pulse signal to be increased.

7. An insulation resistance drop detector, the insulation resistance existing between a body of vehicle and a series-current power supply, comprising:

a detecting resistor being connected in series with an insulating resistor between the body of vehicle and the direct-current power supply;

a coupling capacitor being disposed between the insulating resistor and the detecting resistor;

a pulse signal generator supplying a pulse signal into a series circuit composed of the insulating resistor, the coupling capacitor and the detecting resistor;

a filter for eliminating a signal having a specific frequency from a voltage at a connecting point of the coupling capacitor with the detecting resistor;

a sensor for sensing the drop of the insulation resistance based on an output from the filter;

a changing device for changing a frequency of the pulse signal; and a detecting device for detecting a state of malfunction of the insulation resistance drop detector based on the output of the filter when the frequency has changed.

* * * * *